United States Patent
Mayer et al.

(10) Patent No.: US 10,923,364 B2
(45) Date of Patent: Feb. 16, 2021

(54) METHODS FOR PRODUCING PACKAGED SEMICONDUCTOR DEVICES

(71) Applicant: Infineon Technologies AG, Neubiberg (DE)

(72) Inventors: Kristina Mayer, Regensburg (DE); Michael Ledutke, Saal (DE); Johannes Lodermeyer, Kinding (DE)

(73) Assignee: Infineon Technologies AG, Neubiberg (DE)

( * ) Notice: Subject to any disclaimer, the term of this patent is extended or adjusted under 35 U.S.C. 154(b) by 155 days.

(21) Appl. No.: 16/118,651

(22) Filed: Aug. 31, 2018

(65) Prior Publication Data
US 2019/0074198 A1 Mar. 7, 2019

(30) Foreign Application Priority Data
Sep. 7, 2017 (DE) ................ DE10 2017 215 797.6

(51) Int. Cl.
*H01L 21/56* (2006.01)
*H01L 23/00* (2006.01)
*H01L 23/31* (2006.01)

(52) U.S. Cl.
CPC .......... *H01L 21/561* (2013.01); *H01L 21/566* (2013.01); *H01L 21/568* (2013.01); *H01L 24/02* (2013.01); *H01L 24/13* (2013.01); *H01L 24/96* (2013.01); *H01L 23/3128* (2013.01); *H01L 24/19* (2013.01); *H01L 2224/02313* (2013.01); *H01L 2224/02379* (2013.01); *H01L 2224/04105* (2013.01); *H01L 2224/12105* (2013.01); *H01L 2224/13024* (2013.01); *H01L 2224/24137* (2013.01); *H01L 2224/2518* (2013.01);
(Continued)

(58) Field of Classification Search
CPC ....... H01L 24/96; H01L 24/13; H01L 21/566; H01L 21/568; H01L 24/02; H01L 2224/02313; H01L 2924/10271; H01L 2924/18162; H01L 2224/02379; H01L 2224/04105; H01L 2924/10253; H01L 2224/24137; H01L 2924/14; H01L 2924/1431; H01L 2224/2518; H01L 2924/141; H01L 2924/10272; H01L 23/3128; H01L 2224/13024; H01L 2924/3511; H01L 24/19; H01L 2224/1205; H01L 2924/10329; H01L 2924/1033; H01L 21/561
See application file for complete search history.

(56) References Cited

U.S. PATENT DOCUMENTS

| | | | |
|---|---|---|---|
| 6,881,599 B2 * | 4/2005 | Oohata | H01L 24/24 438/22 |
| 8,012,799 B1 * | 9/2011 | Ibrahim | H01L 21/566 438/107 |
| 2002/0015748 A1 | 2/2002 | Miyajima et al. | |

(Continued)

*Primary Examiner* — Savitri Mulpuri
(74) *Attorney, Agent, or Firm* — Harrity & Harrity, LLP

(57) ABSTRACT

A method comprises: arranging a plurality of semiconductor chips above a carrier, wherein active main surfaces of the semiconductor chips face the carrier; filling a cavity with a molding material; pressing the semiconductor chips arranged on the carrier into the molding material; and separating the molding material with the semiconductor chips embedded therein from the carrier, wherein main surfaces of the semiconductor chips that are situated opposite the active main surfaces are covered by the molding material.

20 Claims, 5 Drawing Sheets

(52) U.S. Cl.
CPC .............. *H01L 2924/1033* (2013.01); *H01L 2924/10253* (2013.01); *H01L 2924/10271* (2013.01); *H01L 2924/10272* (2013.01); *H01L 2924/10329* (2013.01); *H01L 2924/14* (2013.01); *H01L 2924/141* (2013.01); *H01L 2924/1431* (2013.01); *H01L 2924/18162* (2013.01); *H01L 2924/3511* (2013.01)

(56) References Cited

U.S. PATENT DOCUMENTS

| | | | | |
|---|---|---|---|---|
| 2005/0062140 | A1* | 3/2005 | Leung | H01L 33/504 257/678 |
| 2008/0096326 | A1* | 4/2008 | Reed | B29C 45/14647 438/126 |
| 2008/0282540 | A1* | 11/2008 | Singleton | B29C 45/14647 29/856 |
| 2009/0085186 | A1* | 4/2009 | Meyer | H01L 21/561 257/690 |
| 2010/0233831 | A1 | 9/2010 | Pohl et al. | |
| 2011/0241147 | A1* | 10/2011 | Tu | H01L 27/14618 257/434 |
| 2012/0096994 | A1* | 4/2012 | Poole | B25B 7/12 81/342 |
| 2012/0187598 | A1 | 7/2012 | Lee et al. | |
| 2013/0130443 | A1* | 5/2013 | Lu | H01L 24/06 438/113 |
| 2013/0288407 | A1* | 10/2013 | Lo | H01L 33/52 438/27 |
| 2014/0085601 | A1* | 3/2014 | Etzkorn | G02C 7/04 351/159.03 |
| 2015/0152260 | A1 | 6/2015 | Bai | |
| 2016/0365295 | A1* | 12/2016 | Hoegerl | H01L 21/561 |

\* cited by examiner

METHODS FOR PRODUCING PACKAGED SEMICONDUCTOR DEVICES

RELATED APPLICATION

This application claims priority under 35 U.S.C. § 119 to German Patent Application No. 102017215797.6, filed on Sep. 7, 2017 the content of which is incorporated by reference herein in its entirety.

TECHNICAL FIELD

The present disclosure generally relates to semiconductor technology. In particular, the disclosure relates to methods for producing packaged semiconductor devices or semiconductor packages.

BACKGROUND

The components of semiconductor devices can be protected against external influences by a housing. The housings of such semiconductor packages can be fabricated from molding materials (compression molding materials) in potting processes, which materials are firstly deposited in liquid form and are cured after the components have been encapsulated. Methods for producing packaged semiconductor devices have to be continually improved.

SUMMARY

Implementations described herein provide improved solutions to the manufacture of packaged semiconductor devices using alternative materials and alternative process methods to increase productivity.

Various aspects relate to a method comprising: arranging a plurality of semiconductor chips above a carrier, wherein active main surfaces of the semiconductor chips face the carrier; filling a cavity with a molding material; pressing the semiconductor chips arranged on the carrier into the molding material; and separating the molding material with the semiconductor chips embedded therein from the carrier, wherein main surfaces of the semiconductor chips that are situated opposite the active main surfaces are covered by the molding material.

Various aspects relate to a method comprising: arranging a plurality of semiconductor chips above a carrier; filling a mold with a non-liquid molding material; liquefying the molding material; pressing the semiconductor chips into the liquefied molding material; and separating the molding material with the semiconductor chips embedded therein from the carrier.

Various aspects relate to a method comprising: arranging a plurality of semiconductor chips above a carrier, wherein electrical contacts of the semiconductor chips face the carrier; filling a mold with a molding material, wherein no electronic components are situated in the mold during the filling process; pressing the semiconductor chips into the molding material, wherein the molding material is in a liquid state; curing the liquid molding material; and separating the cured molding material with the semiconductor chips embedded therein from the carrier, wherein main surfaces situated opposite the active main surfaces are covered by the cured molding material.

BRIEF DESCRIPTION OF THE DRAWINGS

The accompanying drawings serve to deepen understanding of aspects of the present disclosure. The drawings illustrate embodiments and together with the description serve to elucidate the principles of said aspects. The elements of the drawings need not necessarily be true to scale relative to one another. Identical reference signs designate corresponding similar parts.

DETAILED DESCRIPTION

Figure 1A:
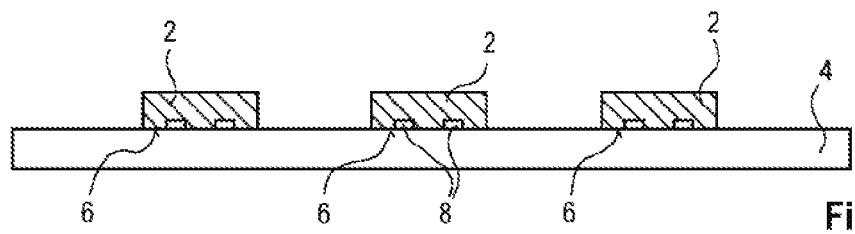
FIGS. 1A to 1D schematically illustrate a lateral cross-sectional view of a method for producing a semiconductor device in accordance with the disclosure.

In the following detailed description, reference is made to the accompanying drawings, which show for illustration purposes specific aspects and embodiments in which the disclosure can be implemented in practice. In this context, direction terms such as, for example, "at the top", "at the bottom", "at the front", "at the back", etc. can be used with respect to the orientation of the figures described. Since the components of the embodiments described can be positioned in different orientations, the direction terms can be used for illustration purposes and are not restrictive in any way whatsoever. Other aspects can be used and structural or logical changes can be made, without departing from the concept of the present disclosure. That is to say that the following detailed description should not be understood in a restrictive sense.

The methods described herein and the devices produced thereby can comprise one or more semiconductor chips (or semiconductor dies). The semiconductor chips can be of different types and can be produced by means of various technologies. In general, the semiconductor chips can contain integrated circuits, passive electronic components, active electronic components, etc. The integrated circuits can be designed as integrated logic circuits, analog integrated circuits, integrated mixed-signal circuits, integrated power circuits, etc. The semiconductor chips need not be produced from a specific semiconductor material. In one example, the semiconductor chips can be produced from an elemental semiconductor material, for example Si, etc. In a further example, the semiconductor chips can be produced from a compound semiconductor material, for example GaN, SiC, SiGe, GaAs, etc. In this case, a produced device comprising a plurality of semiconductor chips can contain both semiconductor chips composed of an elemental semiconductor material and semiconductor chips composed of a compound semiconductor material. Each of the semiconductor chips can comprise one or more electrical contacts (or contact electrodes or contact pads), which can be arranged in particular on a main surface of the semiconductor chip. Such a main surface of the semiconductor chip can be designated hereinafter as active main surface. In this case, a semiconductor chip can also comprise a second active main surface having electrical contacts, said second active main surface being situated opposite the active main surface. Besides semiconductor chips, the devices produced can also comprise all electronic building blocks otherwise possible, for example passive electronic components such as SMDs in the form of coils or resistors, through-contact elements, etc.

In the case of the methods described herein, carriers can be used, on which a plurality of semiconductor chips can be arranged during the method. In one example, the semiconductor chips can be arranged permanently on the carriers. In a further example, the carriers can be temporary carriers, in particular, which can be separated again from the semiconductor chips arranged thereon in the course of the method. In this case, the semiconductor chips can be positioned on the carrier by means of a double-sided adhesive film, which can be detached again from the carrier in the course of the method. By way of example, the carriers can be metal carriers, which can be fabricated in particular from nickel, steel, high-grade steel and/or corresponding alloys. The carriers can have a coefficient of thermal expansion which substantially corresponds to the coefficient of thermal expansion of the semiconductor material of the semiconductor chips and/or corresponds to the coefficient of thermal expansion of a molding material embedding the semiconductor chips.

The methods described herein and the devices produced thereby can comprise a molding material, which can at least partly encapsulate one or more components of a device. The molding material or the molding compound can generally be designed to be used in the context of a molding method, for example: compression molding, injection molding, powder molding, liquid molding, etc. The molding material can be used in various states in the context of the methods described herein. In one example, the molding material can initially be provided in a non-liquid state, in particular in the form of granules or in the form of mold sheets. The non-liquid molding material can then be liquefied with heat being supplied, and cure. In a further example, the molding material can already be provided in a liquid or viscous state and cure after its deposition. The molding material can contain at least one from an epoxy, a filled epoxy, a glass-fiber-filled epoxy, an imide, a thermoplastic, a thermosetting polymer, a polymer mixture.

The methods described herein and the devices produced thereby can comprise a multiplicity of metal layers, which can be arranged above a main surface of a semiconductor chip. In this case, the metal layers can extend laterally beyond the main surface of the semiconductor chip or beyond other materials such as dielectric layers, for example, which are arranged between the semiconductor chip and the metal layers. The metal layers can be used as a redistribution wiring structure in order to electrically couple contact elements of the semiconductor chips to external contact elements of the device. In other words, the metal layers can be designed to make I/O contact pads of the semiconductor chip available at other positions of the device. The metal layers can be structured for example as conductor tracks and be produced for example from at least one from aluminum, nickel, palladium, titanium, titanium-tungsten, silver, tin, gold, molybdenum, vanadium, copper and/or associated metal alloys. A multiplicity of dielectric layers can be arranged between the multiplicity of metal layers in order to electrically insulate the metal layers from one another. Furthermore, metal layers arranged on different planes can be electrically connected to one another by a multiplicity of plated-through holes (or vias).

FIGS. 1A to 1D schematically illustrate lateral cross-sectional views of a method for producing semiconductor devices in accordance with the disclosure. The method is illustrated in a general way in order to qualitatively specify aspects of the disclosure. The method can have further aspects that are not illustrated in FIGS. 1A to 1D. By way of example, the method can be extended by arbitrary aspects described in conjunction with the method illustrated in FIGS. 4A to 4L.

In FIG. 1A, a plurality of semiconductor chips 2 are arranged above or on a carrier 4. The number of three semiconductor chips 2 as shown in the example in FIG. 1A is by way of example and can be chosen differently in further examples. The semiconductor chips 2 need not be of the same type and can have different sizes, thicknesses, etc. The active main surfaces 6 of the semiconductor chips 2 face the carrier 4. The semiconductor chips 2 are arranged on the same plane and parallel to one another in relation to the main surface of the carrier 4. In the example in FIG. 1A, the active main surfaces 6 are indicated by an exemplary number of two electrical contacts 8 of the semiconductor chips 2.

Figure 1B:
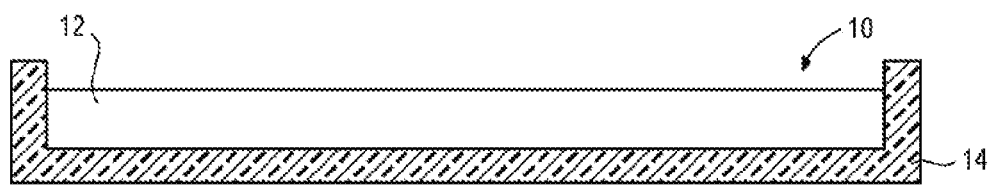

In FIG. 1B, a cavity 10 is filled with a molding material 12. In the example in FIG. 1B, the cavity 10 is formed by a component, such as a mold 14.

Figure 1C:
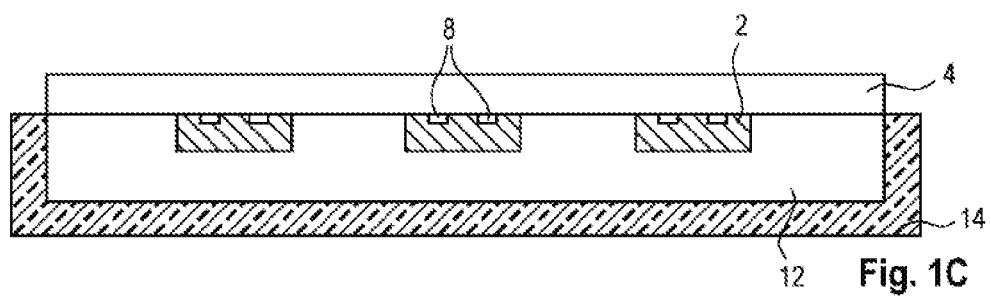

In FIG. 1C, the semiconductor chips 2 arranged on the carrier 4 are pressed into the molding material 12.

Figure 1D:
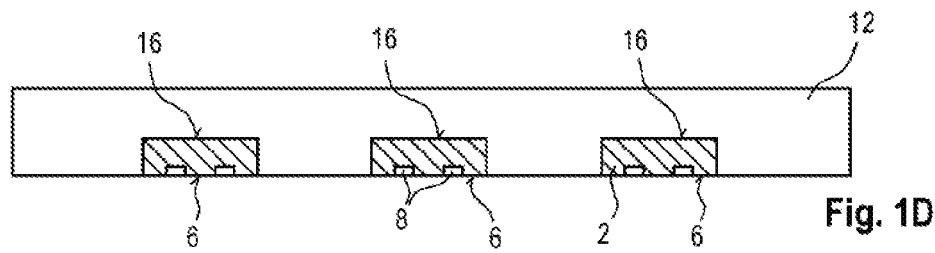

In FIG. 1D, the molding material 12 with the semiconductor chips 2 embedded therein is separated from the carrier 4. The molding material 12 covers main surfaces 16 of the semiconductor chips 2 that are situated opposite the active main surfaces 6 of the semiconductor chips 2.

Accordingly, the method in FIGS. 1A to 1D enables an encapsulation of the semiconductor chips 2 by the molding material 12, in the case of which encapsulation the main surfaces 16 of the semiconductor chips 2 are covered by the molding material 12. Such an encapsulation can be referred to as so-called "overmolding", in which the molding material 12 and the semiconductor chips 2 embedded therein form a so-called "artificial wafer", which can be processed in further steps. In this case, the cavity 10 and the "artificial wafer" formed can have in particular a round shape or a round basic area. In a further example, the cavity 10 can have a quadrilateral or rectangular basic area and the molding material 12 and semiconductor chips arranged on a leadframe strip can form a molded leadframe strip. In yet another example, the molding material 12 and semiconductor chips arranged on a carrier can form a molded panel. However, the method described not only affords the possibility of over¬molding mentioned above, but can advantageously also be combined with a use of molding materials which can often be present in an initially non-liquid state (e.g. as granules) and can be introduced into the cavity 10 by filling in a simple manner here. In comparison with a carrier with semiconductor chips arranged thereon and granules deposited thereon, a cavity filled with the granules can be handled more simply in terms of process engineering. Further advantageous effects of the methods in accordance with the disclosure as described herein are described further below.

In further steps, a redistribution wiring can be formed on the main surface of the semiconductor chips 2 and the main surface of the molding material 12 in order to lead electrical contact-connections of circuit parts of the semiconductor chips 2 toward the outside. Furthermore, after solidifying the molding material 12 can be severed between the semiconductor chips 2, such that a so-called wafer level package, in particular a fan-out wafer level package, with redistribution wiring is formed for the semiconductor chips 2.

FIGS. 2A to 2E schematically illustrate lateral cross-sectional views of a method for producing semiconductor devices in accordance with the disclosure. The method is illustrated in a general way in order to qualitatively specify aspects of the disclosure. The method can have further aspects that are not illustrated in FIGS. 2A to 2E. By way of example, the method can be extended by arbitrary aspects described in conjunction with the method illustrated in FIGS. 4A to 4L.

Figure 2A:
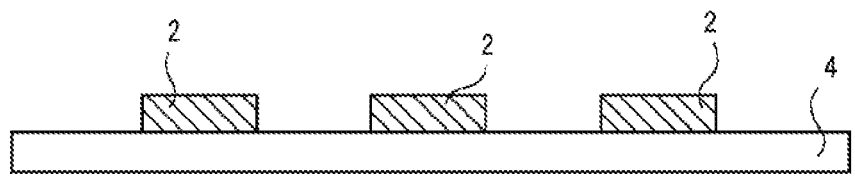
FIGS. 2A to 2E schematically illustrate a lateral cross-sectional view of a method for producing a semiconductor device in accordance with the disclosure.

In FIG. 2A, a plurality of semiconductor chips 2 are arranged above a carrier 4.

Figure 2B:
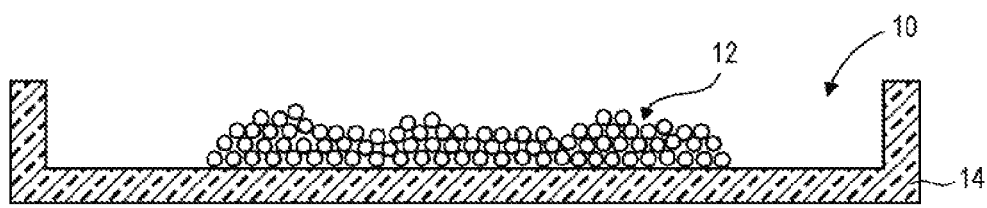

In FIG. 2B, a cavity or a mold 14 is filled with a non-liquid molding material 12. In the non-limiting example in FIG. 2B, the non-liquid molding material 12 is illustrated as granules, i.e. as granular to pulverulent solid material, in the form of small circles.

Figure 2C:

In FIG. 2C, the previously non-liquid molding material 12 is liquefied. By way of example, liquefying the molding material 12 can be achieved by heating the molding material 12.

Figure 2D:
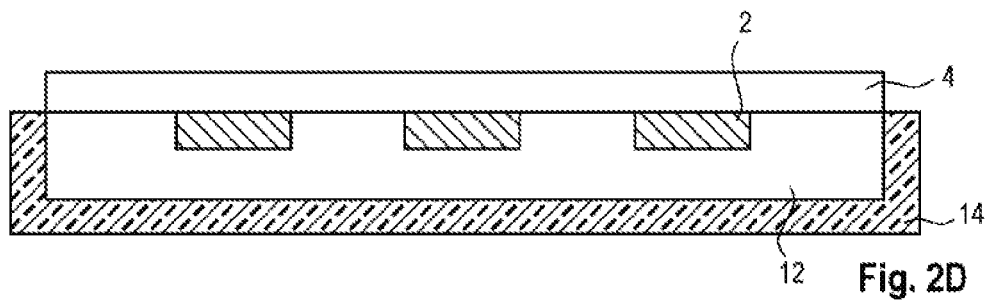

In FIG. 2D, the semiconductor chips 2 are pressed into the liquefied molding material 12.

Figure 2E:
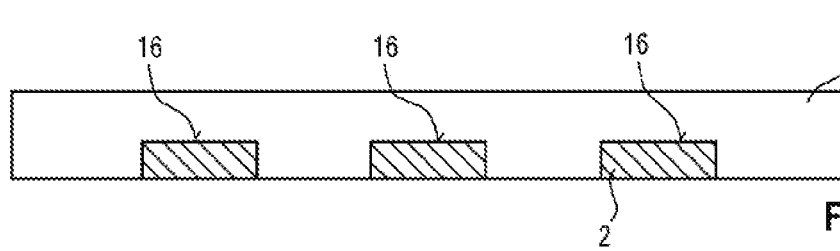

In FIG. 2E, the molding material 12 with the semiconductor chips 2 embedded therein is separated from the carrier 4.

FIGS. 3A to 3D schematically illustrate lateral cross-sectional views of a method for producing semiconductor devices in accordance with the disclosure. The method is illustrated in a general way in order to qualitatively specify aspects of the disclosure. The method can have further aspects that are not illustrated in FIGS. 3A to 3D. By way of example, the method can be extended by arbitrary aspects described in conjunction with the method illustrated in FIGS. 4A to 4L.

Figure 3A:
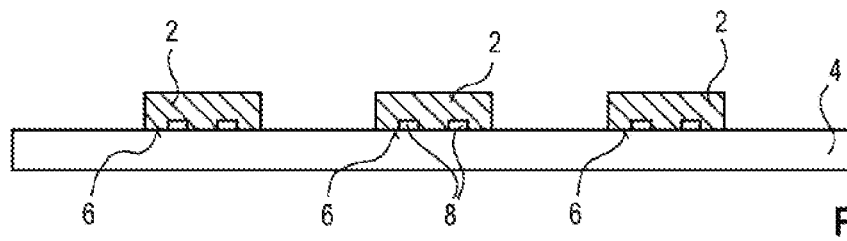
FIGS. 3A to 3D schematically illustrate a lateral cross-sectional view of a method for producing a semiconductor device in accordance with the disclosure.

In FIG. 3A, a plurality of semiconductor chips 2 are arranged above a carrier 4. In this case, electrical contacts 8 of the semiconductor chips 2 face the carrier 4. The electrical contacts 8 are arranged on an active main surface 6 of the semiconductor chips 2.

Figure 3B:
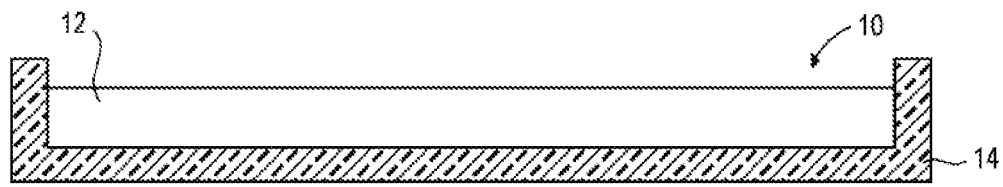

In FIG. 3B, a mold (or cavity) 14 is filled with a molding material 12. During the process of filling the mold 14, no electronic components or electrical components, such as other semiconductor chips, for example, are situated in the mold 14.

Figure 3C:
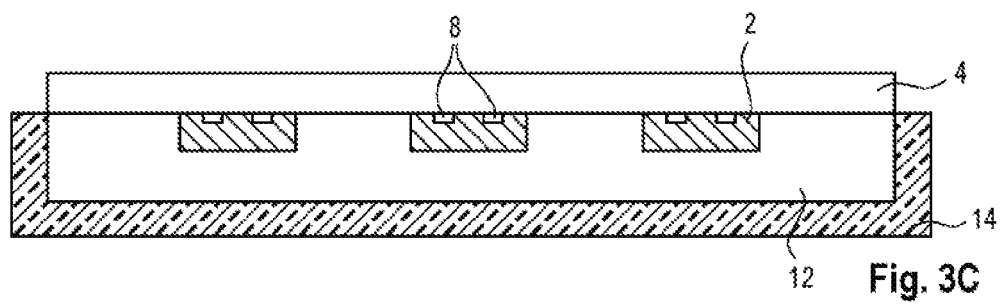

In FIG. 3C, the semiconductor chips 2 are pressed into the molding material 12, wherein the molding material 12 is in a liquid state. The liquid molding material 12 is subsequently cured.

Figure 3D:
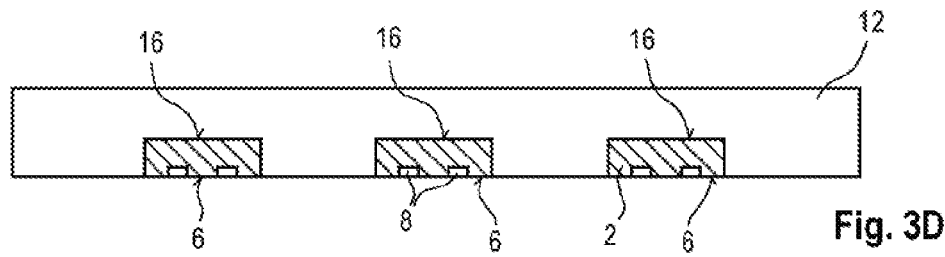

In FIG. 3D, the cured molding material 12 with the semiconductor chips 2 embedded therein is separated from the carrier 4. The molding material 12 covers main surfaces 16 of the semiconductor chips 2 that are situated opposite the active main surfaces 6 of the semiconductor chips 2.

Figure 4A:
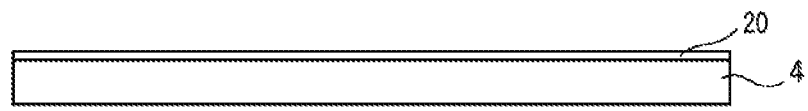
FIGS. 4A to 4L schematically illustrate a lateral cross-sectional view of a method for producing semiconductor devices in accordance with the disclosure. The method in FIGS. 4A to 4L can be regarded as a more detailed implementation of the methods in FIGS. 1A to 3D.
Figure 4B:
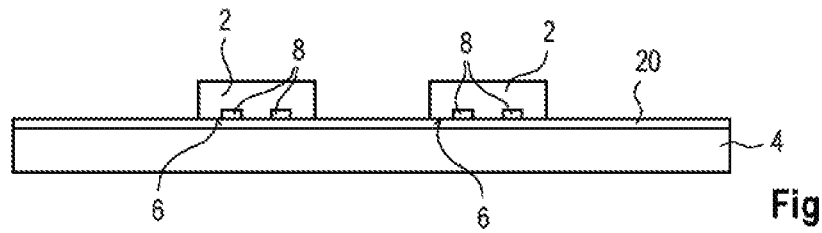
Figure 4C:
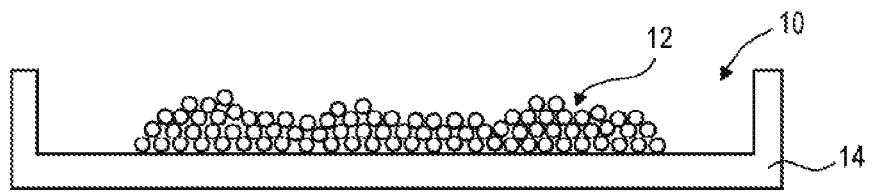
Figure 4D:
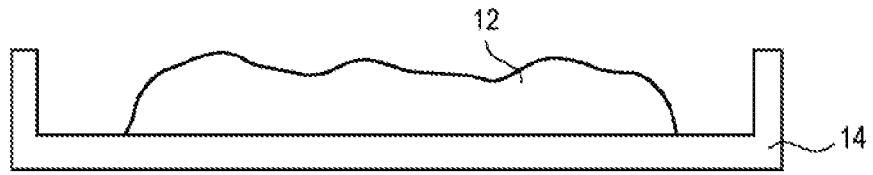
Figure 4E:
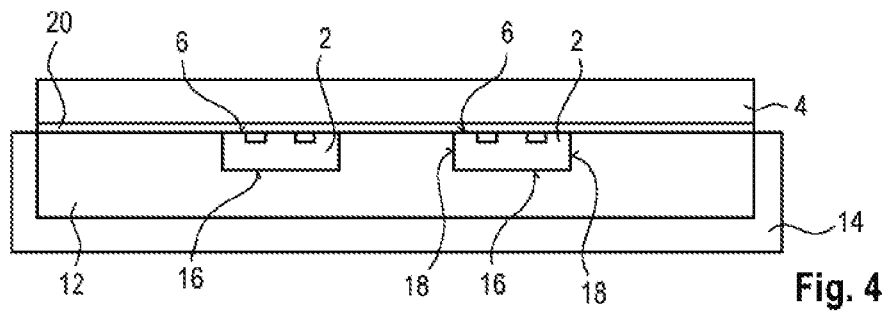
Figure 4F:
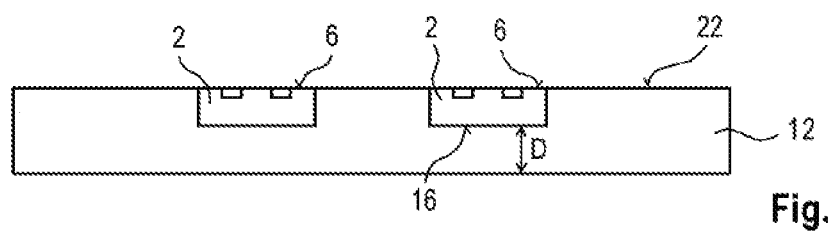
Figure 4G:
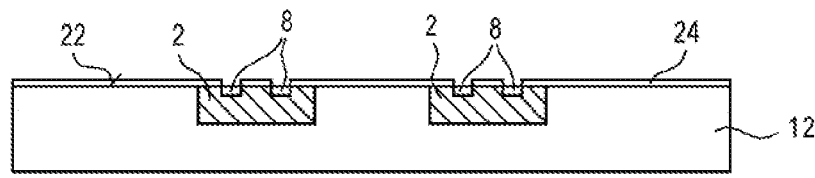
Figure 4H:
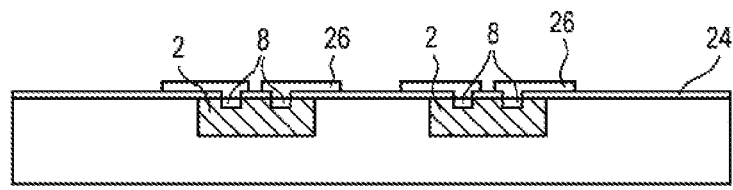
Figure 4I:
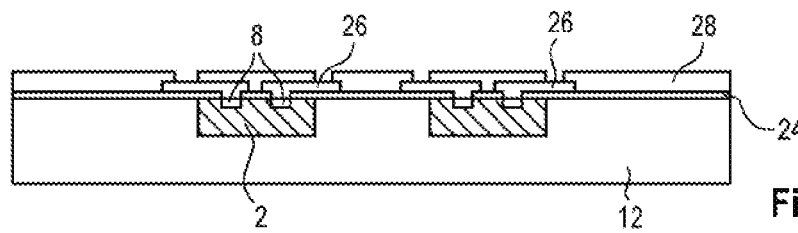
Figure 4J:
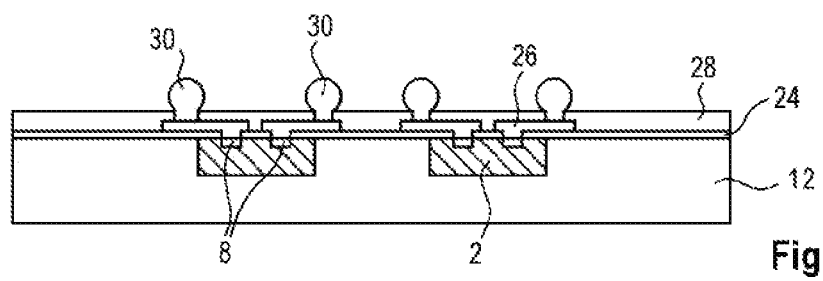
Figure 4K:
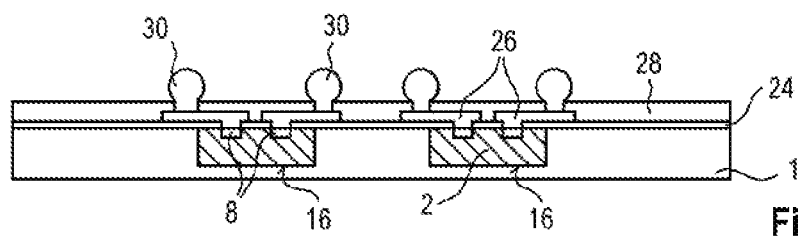
Figure 4L:
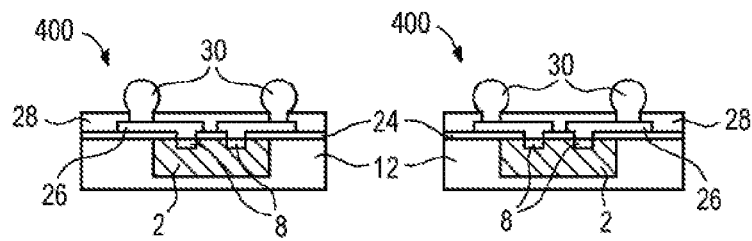

FIGS. 4A to 4L schematically illustrate a method for producing a plurality of semiconductor devices 400, a cross-sectional view of which is shown in FIG. 4L. The method in FIGS. 4A to 4L can be regarded as a more comprehensive implementation of the methods in FIGS. 1A to 3D. That is to say that each of the methods illustrated in FIGS. 1A to 3D can be extended by arbitrary aspects of the method in FIGS. 4A to 4L.

In FIG. 4A, a carrier 4 can be provided, which can have at least one planar surface on which semiconductor chips can be arranged. By way of example, the carrier 4 can be a metal carrier, which can be fabricated in particular from nickel, steel, high-grade steel and/or corresponding alloys. The carrier 4 can have a coefficient of thermal expansion that substantially corresponds to the coefficient of thermal expansion of the semiconductor material of semiconductor chips to be arranged on the carrier 4. Furthermore, the coefficient of thermal expansion of the carrier 4 can substantially correspond to the coefficient of thermal expansion of a molding material deposited on the carrier later. In one example, a double-sided adhesive film 20 can be applied on the carrier 4, said adhesive film being designed to provide a mechanical connection between the carrier 4 and semiconductor chips to be arranged thereon. In further examples, a mechanical connection between the carrier 4 and semiconductor chips to be arranged thereon can be provided in any other manner desired, for example by means of an adhesive layer applied by spin-coating or by an adhesive layer applied by spraying.

In FIG. 4B, semiconductor chips 2 can be arranged on the carrier 4 or the adhesive film 20, wherein active main surfaces 6 of the semiconductor chips 2 having electrical contacts 8 can face the carrier 4. Only two semiconductor chips are shown in the example in FIG. 4B for illustration reasons. In further examples, the number of semiconductor chips can be chosen arbitrarily differently. The semiconductor chips 2 can be of the same type or can differ from one another. The semiconductor chips 2 can be spaced apart from one another, in particular, such that interspaces are formed between the individual semiconductor chips 2.

In FIG. 4C, a cavity 10 can be provided, which can be formed by a mold 14 in the example shown. The cavity 10 can be filled by a molding material 12, which can contain at least one from an epoxy, a filled epoxy, a glass-fiber-filled epoxy, an imide, a thermoplastic, a thermosetting polymer, a polymer mixture. In the example in FIG. 4C, the cavity 10 can be filled with a non-liquid molding material 12 in the form of granules, which can be liquefied at a later point in time. In comparison therewith, in other methods, a liquid molding material is often deposited above a carrier with semiconductor chips arranged thereon. Such deposition of the molding material onto the chip top sides is impracticable with a granulated molding material since subsequent liquefaction of the molding material is difficult to achieve. A uniform supply of heat into the granules is made more difficult on account of the arrangement of the carrier, the adhesive film and the semiconductor chips. Moreover, for a transition of the solid granules to a liquid state, an increased supply of heat is necessary compared with the required supply of heat for further liquefaction of a viscous molding material. In a further example in accordance with FIG. 4C, the mold 14 can be filled with the molding material 12 already in a liquid state. Independently of its state, the molding material 12 can only partly or completely cover the bottom surface of the mold 14. In one example, the bottom surface of the mold 14 can be partly or completely lined with a Teflon film (not illustrated) in order to be able to separate the molding material 12 at a later point in time in a cured form from the mold 14 more easily. During the process of filling the mold 14 by the molding material 12, no electronic components or electrical components are situated in the mold 14. In particular, no further semiconductor chips 2 which are intended to be encapsulated by the molding material 12 are arranged in the mold 14.

In FIG. 4D, the previously granulated molding material 12 can be liquefied. By way of example, liquefying the molding material 12 can be achieved by heating the molding material 12. In one example, for this purpose, the mold 14 can be heated and emit heat to the molding material 12 situated in the mold 14. Additionally or alternatively, heat or thermal energy can be fed to the molding material 12 via other components as well. By way of example, the carrier 4 with the semiconductor chips 2 arranged thereon can be heated and provide for heating of the molding material 12 upon later contact with the molding material 12. In one example, the liquefied molding material 12 can cover the entire bottom of the mold 14. In this case, the level of the molding material 12 can be in particular lower than the height of the side walls of the mold 14 in order that the molding material 12 can be displaced during later immersion of semiconductor chips. In the example in FIG. 4D, the liquefied molding material 12 can cover only part of the bottom of the mold 14 and in this case have in particular the form of a drop. In this example, the liquefied molding material 12 is in a viscous state and, without additional pressure, will not deliquesce further and will not cover the entire bottom of the mold 14.

In FIG. 4E, the semiconductor chips 2 arranged on the carrier 4 can be dipped or pressed into the liquid molding material 12. In this case, main surfaces 16 of the semiconductor chips 2 that are situated opposite the active main surfaces 6 and side surfaces 18 of the semiconductor chips 2 can be covered by the molding material 12. As a result of the semiconductor chips 2 being pressed into the liquid molding material 12, the molding material 12 previously in the form of a drop is distributed in the mold 14. In one example, the molding material 12 can then cover the entire surface of the carrier 4 or of the adhesive film 20. The amount of molding material 12 can be chosen such that the molding material 12 fills the entire region between the carrier 4 and the inner surfaces of the mold 14. After the semiconductor chips 2 have been pressed into the molding material 12, the molding material 12 can cure and form a stable housing for protecting the semiconductor chips 2.

In FIG. 4F, the cured molding material 12 with the semiconductor chips 2 embedded therein can be separated from the mold 14. In this case, an optional Teflon film (not illustrated) at the bottom of the mold 14 can remain in the mold 14. Furthermore, the molded housing 12 with the semiconductor chips 2 embedded therein can be separated from the carrier 4 and the adhesive film 20. In this case, the adhesive film 20 can be designed to allow simplified release at an elevated temperature from the carrier 4 and the molding material 12. After the removal of the carrier 4 and the adhesive film 20, the upper main surface of the molding material 12 and the active main surfaces 6 of the semiconductor chips 2 can form a common coplanar plane 22. As described below, a redistribution wiring structure can be formed above this common plane 22. A thickness D of the molding material 12, measured from the opposite main surface 16 of the respective semiconductor chip 2 to the lower main surface of the molded housing 12, can lie in a range of approximately 50 micrometers to approximately 1000 micrometers, in particular of approximately 100 micrometers to approximately 200 micrometers.

In FIG. 4G, an optional first dielectric layer 24 can be formed above the surface 22. By way of example, the first dielectric layer 24 can be deposited from a gaseous or liquid phase or be laminated onto the surface 22. Additionally or alternatively, a thin-film technology or a standard PCB process can be used in the production of the dielectric layer 24. The first dielectric layer 24 can be produced for example from a polymer, polynorbornene, parylene, photoresist, imide, epoxy, silicon nitride and/or silicon oxide and can have a thickness of up to 10 micrometers or higher. The first dielectric layer 24 can firstly be deposited above the surface 22 over a large area and then be opened at the locations of the electrical contacts 8 of the semiconductor chips 2 in order to expose the latter. The openings can be produced for example by photolithographic methods, etching methods and/or laser application.

In FIG. 4H, a metal layer 26 can be deposited above the first dielectric layer 24. By way of example, the metal layer 26 can be produced by sputtering, electroless deposition and/or vapor deposition and can contain for example aluminum, nickel, palladium, titanium, titanium-tungsten, silver, tin, gold, copper and/or corresponding alloys. The metal layer 26 can firstly be deposited above the first dielectric layer 24 over a large area and in this case electrically contact the previously exposed electrical contacts 8 of the semiconductor chips 2. The metal layer 26 can then be structured, as is shown by way of example in FIG. 4H. A structuring of the metal layer 26 can be achieved for example as follows: depositing an etching-resistant layer (not illustrated) above parts of the metal layer 26 that are to be removed, etching the parts of the metal layer 26 that are not covered by the etching-resistant layer, removing the etching-resistant layer and in the process uncovering the residual parts of the metal layer 26. In a further example, plating with current (pattern plating) can be employed. To that end, firstly a thin seed layer over the whole area is applied as a barrier. The seed layer can be fabricated for example from TiW, Ti and/or Cu and be applied by means of a CVD or PVD method. Afterward, by means of a thin-film technique, a resist is applied and structured at the required locations. Metal is then deposited in a plating bath by means of pattern plating at the locations of the opened resist. After plating, the resist and the seed layer are removed, for example by means of an etching process.

In FIG. 4I, a second dielectric layer 28 can be deposited above the metal layer 26. The second dielectric layer 28 can firstly be deposited over a large area and then be opened at locations at which external contact elements are intended to be arranged later. As a result of the second dielectric layer 28 being opened, the metal layer 26 is uncovered at the corresponding positions.

In FIG. 4J, external contact elements 30 can be arranged in the openings of the second dielectric layer 28 and in the process electrically contact the metal layer 26. The external contact elements 30 can be solder balls, for example. A UBM (under bump metallization) layer (not illustrated) can additionally be arranged between the metal layer 26 and the external contact elements 30.

The metal layer 26 and the dielectric layers 24 and 28 form a redistribution wiring structure that provides an electrical connection between the electrical contacts 8 of the semiconductor chips 2 and the external contact elements 30. The I/O contact pads 8 of the semiconductor chips 2 are thereby made available at other positions of the device to be produced. In the example in FIGS. 4A to 4J, only one metal layer 26 and two dielectric layers 24 and 28 are specified. In further examples, the number of metal layers and dielectric layers can be chosen differently, as required. Furthermore, metal layers arranged on different planes can be electrically connected to one another by means of plated-through holes (or vias). As a result of this redistribution or redistribution wiring of the electrical contacts 8 of the semiconductor chips 2, the latter can be fanned out and cover a larger area. That is to say that the distances between the electrical contacts 8 are smaller than the distances between the external contact elements 30. One example of semiconductor devices having electrical contacts fanned out in this way is fan-out wafer level packages (FOWLP).

In FIG. 4K, the molding material 12 on the underside of the molded housing 12 above the opposite main surfaces 16 of the semiconductor chips 2 can be at least partly removed in order to reduce the height of the device. In one example, the molding material 12 in this case can be removed by means of a grinding process. The molding material 12 can be completely removed above the rear sides or main surfaces 16 of the semiconductor chips 2. In this case, the semiconductor material of the respective semiconductor chip 2, possibly present electrical contacts on the rear sides of the semiconductor chips 2 and possibly present plated-through holes (via bars, TSV (through silicon vias), TMV (through mold vias)) from the rear side to the front side of the semiconductor chip 2 (TSV) or from the rear side to the front side of the molding material 12 (TMV) can also be uncovered. On the rear side of the respective semiconductor chip 2, a redistribution layer (RDL) can be formed, which can be connected to the electrical contacts on the rear sides of the semiconductor chips and the plated-through holes.

In FIG. 4L, the device can be separated into two semiconductor devices 400, for example by sawing, cutting, etching and/or applying a laser. The separation of the semiconductor devices 400 in this case can proceed in particular through the molding material 12.

The methods described herein and the devices produced thereby can provide the technical features and effects explained below. The following enumeration here should be understood to be neither limiting nor exhaustive.

In the case of the methods described here, the molding material can be heated uniformly and rapidly by virtue of its arrangement in a mold. Smooth and uniform interfaces of the molding material can result in this case. As a result, it is possible to prevent in particular interaction layers between the molding material and further components, such as the redistribution layer, for example. Furthermore, as a result of the uniform and rapid heating of the molding material, distortion or warpage of the encapsulation body with the semiconductor chips embedded therein can be avoided or at least reduced.

By pressing the semiconductor chips into the liquid molding material substantially perpendicularly, it is possible for a lateral displacement of the semiconductor chips to be prevented or at least reduced. As a result of the reduced lateral displacement of the semiconductor chips, it is possible to improve the accuracy or precision during production of the redistribution wiring structure. The area of the electrical contacts of the semiconductor chips can be chosen to be smaller on account of this improved accuracy.

In the case of the methods described here, the molding material is not necessarily deposited on the semiconductor chips, rather the semiconductor chips are pressed into the molding material for their encapsulation. In this case, the mold can be filled with the molding material in an initially non-liquid or viscous state. In the case of the methods described here, therefore, non-liquid molding materials, such as granulated molding materials, for example, can also be used besides liquid molding materials. As a result, it is possible to have recourse to a greater diversity of molding materials during the production of the housing. The use of granulated molding materials can be more cost-effective in comparison with the use of liquid molding materials.

In the case of the methods described here, the molding material is deposited into a mold. In comparison with depositing the molding material onto a carrier with semiconductor chips arranged thereon, depositing the molding material into a mold can be handled more simply in terms of process engineering. The process for encapsulating the semiconductor chips can thus be improved and optimized by the methods described.

Within the meaning of the present description, the terms "connected", "coupled", "electrically connected" and/or "electrically coupled" need not necessarily mean that components must be directly connected or coupled to one another. Intervening components can be present between the "connected", "coupled", "electrically connected" or "electrically coupled" components.

Furthermore, the word "above" used for example with respect to a material layer that is formed "above" a surface of an object or is situated "above" said surface can be used in the present description in the sense that the material layer is arranged (for example formed, deposited, etc.) "directly on", for example in direct contact with, the surface meant. The word "above" used for example with respect to a material layer that is formed or arranged "above" a surface can also be used in the present text in the sense that the material layer is arranged (e.g. formed, deposited, etc.) "indirectly on" the surface meant, wherein for example one or more additional layers are situated between the surface meant and the material layer.

Insofar as the terms "have", "contain", "encompass", "with" or variants thereof are used either in the detailed description or in the claims, these terms are intended to be inclusive in a similar manner to the term "comprise". That means that within the meaning of the present description the terms "have", "contain", "encompass", "with", "comprise" and the like are open terms which indicate the presence of stated elements or features but do not exclude further elements or features. The articles "a/an" or "the" should be understood such that they include the plural meaning and also the singular meaning, unless the context clearly suggests a different understanding.

Furthermore, the word "exemplary" is used in the present text in the sense that it serves as an example, a case or an illustration. An aspect or a design that is described as "exemplary" in the present case should not necessarily be understood in the sense as though it has advantages over other aspects or designs. Rather, the use of the word "exemplary" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say that if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one from A and B or the like generally means A or B or both A and B.

Devices and methods for producing devices are described in the present text. Observations made in connection with a device described can also apply to a corresponding method, and vice versa. If a specific component of a device is described, for example, then a corresponding method for producing the device can contain a process for producing the component in a suitable manner, even if such a process is not explicitly described or illustrated in the figures. Moreover, the features of the various exemplary aspects described in the present text can be combined with one another, unless expressly noted otherwise.

Although the disclosure has been shown and described with respect to one or more implementations, equivalent alterations and modifications based at least in part on the reading and understanding of this description and the accompanying drawings will be apparent to the person skilled in the art. The disclosure includes all such modifications and alterations and is restricted solely by the concept of the following claims. Especially with respect to the various functions that are implemented by the above-described components (for example elements, resources, etc.), the intention is that, unless indicated otherwise, the terms used for describing such components correspond to any components which implement the specified function of the described component (which is functionally equivalent, for example), even if it is not structurally equivalent to the disclosed structure which implements the function of the exemplary implementations of the disclosure as presented herein. Furthermore, even if a specific feature of the disclosure has been disclosed with respect to only one of various implementations, such a feature can be combined with one or more other features of the other implementations in a manner such as is desired and advantageous for a given or specific application.

What is claimed is:

1. A method comprising:
   arranging a plurality of semiconductor chips above a carrier,
       wherein active main surfaces of the plurality of semiconductor chips face the carrier;
   filling a cavity with a molding material,
       wherein the cavity is filled with the molding material in:
           a liquid form, or
           a non-liquid form and the molding material is liquefied by heating the molding material;
   pressing the plurality of semiconductor chips arranged on the carrier into the molding material; and
   separating the molding material with the plurality of semiconductor chips embedded therein from the carrier,
       wherein opposite main surfaces of the semiconductor chips, that are situated opposite the active main surfaces, are covered by the molding material.

2. The method as claimed in claim 1, wherein a thickness of the molding material, above the opposite main surfaces of the plurality of semiconductor chips, lies in a range of approximately 50 micrometers to approximately 1000 micrometers.

3. The method as claimed in claim 1, wherein the cavity is free of electronic components during the filling of the cavity with the molding material.

4. The method as claimed in claim 1, wherein the cavity, when filled with the molding material in the non-liquid form, is filled with molding material in a form of granules.

5. The method as claimed in claim 1, wherein the cavity is formed by a mold, and
   wherein liquifying the molding material in the non-liquid form, comprises:
       liquifying the molding material in the non-liquid form by heating the mold.

6. The method as claimed in claim 1, wherein a main surface of the molding material and the active main surfaces of the plurality of semiconductor chips lie in a common plane after the separating of the molding material with the plurality of semiconductor chips embedded therein from the carrier.

7. The method as claimed in claim 1, further comprising:
   forming a redistribution wiring structure above the active main surfaces of the plurality of semiconductor chips after the separating of the molding material with the plurality of semiconductor chips embedded therein from the carrier.

8. The method as claimed in claim 1, further comprising:
   at least partly removing the molding material above the opposite main surfaces, of the plurality of semiconductor chips, that are situated opposite the active main surfaces of the plurality of semiconductor chips.

9. The method as claimed in claim 1, further comprising:
   curing the molding material; and
   wherein separating the molding material with the plurality of semiconductor chips embedded therein from the carrier comprises:
       separating the molding material with the plurality of semiconductor chips embedded therein into a plurality of wafer level packages after curing the molding material.

10. The method as claimed in claim 1, wherein the molding material comprises at least one of an epoxy, a filled epoxy, a glass-fiber-filled epoxy, an imide, a thermoplastic, a thermosetting polymer, or a polymer mixture.

11. A method comprising:
    arranging a plurality of semiconductor chips above a carrier,
        wherein electrical contacts of the plurality of semiconductor chips face the carrier;
    filling a mold with a molding material,
        wherein no electronic components are situated in the mold during the filling of the mold with the molding material;
    pressing the plurality of semiconductor chips into the molding material,
        wherein the molding material is a liquid molding material during the pressing of the plurality of semiconductor chips into the molding material;
    curing the liquid molding material to form a cured molding material; and
    separating the cured molding material with the plurality of semiconductor chips embedded therein from the carrier,
        wherein main surfaces of the plurality of semiconductor chips, that are situated opposite active main surfaces of the plurality of semiconductor chips, are covered by the cured molding material and the active main surfaces are exposed.

12. The method as claimed in claim 11, further comprising:
    before filling the mold with the molding material, arranging a film in the mold, wherein the film contains Teflon.

13. The method as claimed in claim 11, wherein the plurality of semiconductor chips are arranged above the carrier using an adhesive film.

14. The method as claimed in claim 11, further comprising:
    after separating the cured molding material with the plurality of semiconductor chips embedded therein from the carrier, separating the cured molding material with the plurality of semiconductor chips embedded therein into a plurality of wafer level packages.

15. The method as claimed in claim 11, wherein the mold is filled with the molding material in a non-liquid form and the molding material is liquefied, to form the liquid molding material, by heating the molding material before the pressing of the plurality of semiconductor chips into the molding material.

16. The method as claimed in claim 1, wherein the cavity, when filled with the molding material in the non-liquid form, is filled with molding material in a form of mold sheets.

17. The method as claimed in claim 1, further comprising:
curing the molding material; and
wherein separating the molding material with the plurality of semiconductor chips embedded therein from the carrier comprises:
separating the molding material with the plurality of semiconductor chips embedded therein from the carrier after curing the molding material.

18. The method as claimed in claim 1, further comprising:
applying an adhesive film on the carrier; and
wherein arranging the plurality of semiconductor chips above the carrier comprises:
arranging the plurality of semiconductor chips on the adhesive film.

19. The method as claimed in claim 18, wherein separating the molding material with the plurality of semiconductor chips embedded therein from the carrier comprises:
separating the molding material with the plurality of semiconductor chips embedded therein from the carrier and the adhesive film.

20. The method as claimed in claim 11, further comprising:
forming a redistribution wiring structure above the active main surfaces of the plurality of semiconductor chips after separating of the cured molding material.

* * * * *